United States Patent
Lin et al.

(10) Patent No.: US 8,183,561 B2
(45) Date of Patent: May 22, 2012

(54) OLED PANEL WITH BROADENED COLOR SPECTRAL COMPONENTS

(75) Inventors: Hao-Wu Lin, Hsinchu (TW); Shih-Feng Hsu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 345 days.

(21) Appl. No.: 12/459,021

(22) Filed: Jun. 24, 2009

(65) Prior Publication Data

US 2010/0327263 A1    Dec. 30, 2010

(51) Int. Cl.
*H01L 35/24* (2006.01)

(52) U.S. Cl. .............. 257/40; 257/79; 257/E51.001

(58) Field of Classification Search .......... 257/40, 257/79, E51.001
See application file for complete search history.

(56) References Cited

U.S. PATENT DOCUMENTS

| | | | |
|---|---|---|---|
| 7,400,088 B2 * | 7/2008 | Ryu | 313/504 |
| 7,816,857 B2 * | 10/2010 | Ryu et al. | 313/504 |
| 7,875,983 B2 * | 1/2011 | Yoo et al. | 257/777 |
| 2003/0044639 A1 | 3/2003 | Fukuda | 428/690 |
| 2008/0018239 A1 | 1/2008 | Matsuda et al. | 313/504 |
| 2008/0203903 A1 | 8/2008 | De Kok et al. | 313/504 |
| 2009/0231243 A1 | 9/2009 | Song | 345/76 |
| 2011/0095279 A1 | 4/2011 | Mizuno et al. | |

FOREIGN PATENT DOCUMENTS

| | | |
|---|---|---|
| CN | 1391424 A | 1/2003 |
| CN | 102084720 | 6/2011 |
| EP | 2101356 A1 | 9/2009 |

OTHER PUBLICATIONS

Chinese Office Action dated Jul. 30, 2010 issued by the Chinese Patent Office.
European Search Report dated Aug. 18, 2011 issued by the European Patent Office.
English Abstract of CN 102084720, published Jun. 1, 2011, Canon Kabushiki Kaisha (1 page).

* cited by examiner

*Primary Examiner* — Anthony Ho

(57) ABSTRACT

A method and device in which the light emitted from a color sub-pixel in an organic light emitted display panel can be the sum of two or more light beams of slightly different colors in the same wavelength range. The difference in color is the result of difference in the length of the resonant cavity within the same color sub-pixel. In the manufacturing process, the non-uniformity in the layer thickness can cause a shift in the color coordinates in the color sub-pixels. The color shift when the width of the color spectrum is narrow is more noticeable. By broadening the width of the color spectrum, the color shift would become less appreciable. Thus, broadening the width of the color spectrum would ease the strict requirements in manufacturing.

11 Claims, 11 Drawing Sheets

OLED PANEL WITH BROADENED COLOR SPECTRAL COMPONENTS

FIELD OF THE INVENTION

The present invention relates generally to an organic light-emitting device and, more particularly, to an active-matrix display panel having a plurality of color pixels composed of the organic light-emitting devices.

BACKGROUND OF THE INVENTION

An active matrix display device, such as an active-matrix organic light-emitting display panel, has a two-dimensional pixel array comprising a plurality of pixel rows. Each of the pixel rows has a plurality of pixels arranged in the x direction, as shown in FIG. 1. These pixel rows are arranged as lines in the y direction so that they can be sequentially driven by a plurality of scanning signals provided by the scanning lines in one or more scanning circuits. In FIG. 1, the display panel 1 has a plurality of color pixels 10 arranged in a two-dimensional array.

In a color organic light-emitting display panel, each color pixel 10 generally comprises three color sub-pixels R, G, B for emitting red, green and blue colors, respectively, as shown in FIG. 2. The color sub-pixels R, G, B comprise three different organic light-emitting devices 24, 25 and 26 in a diode form. Organic light-emitting diodes (OLEDs) are known in the art. For example, the red organic light-emitting device 24 is an organic electroluminescent device having a plurality of organic layers disposed between a cathode layer 150 and an anode layer 110 formed on a substrate 100, as shown in FIG. 3. The organic layers in the organic layer section consist of a hole injection layer (HIL) 120, a hole transport layer (HTL) 122, an emissive layer (EML) 130, and an electron transport layer (ETL) 140. The green and blue organic light-emitting devices 25 and 26 are structurally similar to the layer structure as shown in FIG. 3, except that each of the organic light-emitting devices 24, 25 and 26 comprises a different light emitting material in the EML layer so that each device emits a different color spectrum. In FIG. 3, the thickness of the organic layer section, L, serves as a resonant cavity in an OLED.

Each of color spectra has a different spectral peak expressed by the coordinates in a CIE color space. For example, a red color spectrum can be represented by CIEx: 0.682 color coordinate. It is desirable to produce an organic light emitting display wherein the CIE coordinates can be controlled.

SUMMARY OF THE INVENTION

The present invention provides a method and device in which the light emitted from a color sub-pixel can be the sum of two or more light beams of slightly different colors in the same wavelength range. The difference in color is the result of difference in the length of the resonant cavity within the same color sub-pixel.

Thus, the first aspect of the present invention is a method for use in an organic light emitting display panel, the light emitting panel comprises a plurality of color sub-pixels, each color sub-pixel configured to emit light in a color spectrum of a first wavelength distribution within a wavelength range. The method comprises:

arranging at least some of the color sub-pixels to emit light in a color spectrum of a different second wavelength distribution within said wavelength range; and combining the emitted light of the first wavelength distribution and the emitted light of the second wavelength distribution for providing combined emitted light.

According to various embodiments of the present invention, the color spectrum of the first wavelength distribution has a first spectral width and the color spectrum of the second wavelength has a second spectral width, wherein the combined emitted light has color spectrum with a third spectral width broader than the first spectral width and broader than the second spectral width.

According to the present invention, each of the color sub-pixels comprises a light emitting component, the light emitting component comprises a first organic layer section disposed between an anode layer and a cathode layer, the first organic section comprising a first thickness between the anode layer and the cathode layer for emitting light in the color spectrum of the first wavelength distribution and a second organic layer section disposed between an anode layer and a cathode layer, the first organic section comprising a first thickness between the anode layer and the cathode layer for emitting light in the color spectrum of the second wavelength distribution. Each of the first organic layer section and the second organic layer section comprises:

an emissive layer between the anode layer and the cathode layer;

a hole transport layer between the emissive layer and the anode layer; and an electron transport layer between the emissive layer and the cathode layer.

Each of the first organic layer section and the second organic layer section may also comprises a hole injection layer between the hole transport layer and the anode layer.

The second aspect of the present invention is an organic light emitting device. The device comprises:

an anode layer;

a cathode layer;

a first organic layer section between the anode layer and the cathode layer, the first organic layer section comprising a first thickness arranged for emitting light in a color spectrum of a first wavelength distribution in a wavelength range, and a second organic layer section between the anode layer and the cathode layer, the second organic layer section comprising a second thickness different from the first thickness arranged for emitting light in a color spectrum of a second wavelength distribution in said wavelength range.

The third aspect of the present invention is an organic light emitting display panel. The display panel comprises:

a plurality of color sub-pixels, each sub-pixel comprising an anode layer; a cathode layer; a first organic layer section between the anode layer and the cathode layer, the first organic layer section comprising a first thickness arranged for emitting light in a color spectrum of a first wavelength distribution in a wavelength range, wherein at least some of the color sub-pixels comprise a second organic layer section between the anode layer and the cathode layer, the second organic layer section comprising a second thickness different from the first thickness arranged for emitting light in a color spectrum of a second wavelength distribution in said wavelength range.

According to various embodiments of the present invention, the color spectrum of the first wavelength distribution has a first spectral width and the color spectrum of the second wavelength distribution has a second spectral width, and wherein the combined emitted light has a color spectrum with a third spectral width broader than the first spectral width and broader than the second spectral width.

According to various embodiments of the present invention, each of the color sub-pixels comprises a light emitting component, the light emitting component comprises a first organic layer section disposed between an anode layer and a cathode layer, the first organic section comprising a first thickness between the anode layer and the cathode layer for emitting light in the color spectrum of the first wavelength distribution, and a second organic layer section disposed between the anode layer and the cathode layer, the second organic section comprising a second thickness between the anode layer and the cathode layer for emitting light in the color spectrum of the second wavelength distribution.

The difference between the first thickness and the second thickness can be in the range of 0.5% to 30%, dependent upon the resonance order of the cavity.

According to various embodiments of the present invention, each of the first organic layer section and the second organic layer section comprises:

an emissive layer between the anode layer and the cathode layer;

a hole transport layer between the emissive layer and the anode layer; and an electron transport layer between the emissive layer and the cathode layer.

According to various embodiments of the present invention, each of the first organic layer section and the second organic layer section further comprises a hole injection layer between the hole transport layer and the anode layer.

According to various embodiments of the present invention, the plurality of color sub-pixels comprise a plurality of red sub-pixels having a wavelength range between 600 nm and 640 nm; a plurality of green sub-pixels having a wavelength range between 510 nm and 550 nm; and a plurality of blue sub-pixels with a wavelength range between 440 nm-480 nm.

The present invention will become apparent upon reading the description taken in conjunction with FIGS. 4-16.

BRIEF DESCRIPTION OF THE DRAWINGS

FIG. 12b shows the application of a common layer to order to achieve the pixels as shown in FIG. 12a.

DETAILED DESCRIPTION OF THE INVENTION

In an organic light-emitting diode (OLED) where the organic layers are placed in a resonant cavity, the coordinates of the spectrum in the color space is shifted if the length of the resonant cavity changes. The shifting of the color coordinates means a change in the color of the emitted light. The shifting of the color coordinates is dependent upon the width of the color spectrum. A spectrum having a broader spectral width, in general, will have a lesser effect in the changes of color. In an OLED, the spectral width can vary with the thickness of the cathode layer, for example. The width of a color spectrum can be increased over 100% if the thickness of the cathode layer reduces from 20 nm to 10 nm. An OLED with a thin cathode layer, however, has a shorter life and its light-emitting efficiency is inferior to an OLED with a thicker cathode layer.

Figure 2:
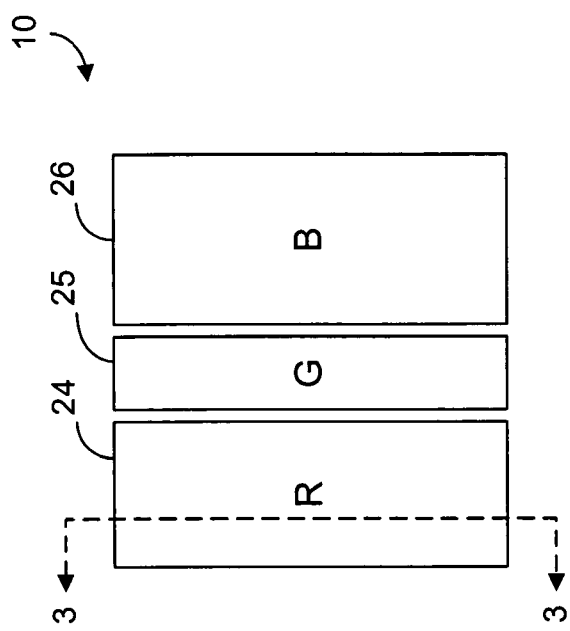
FIG. 2 shows a typical pixel having three color sub-pixels.
Figure 1:
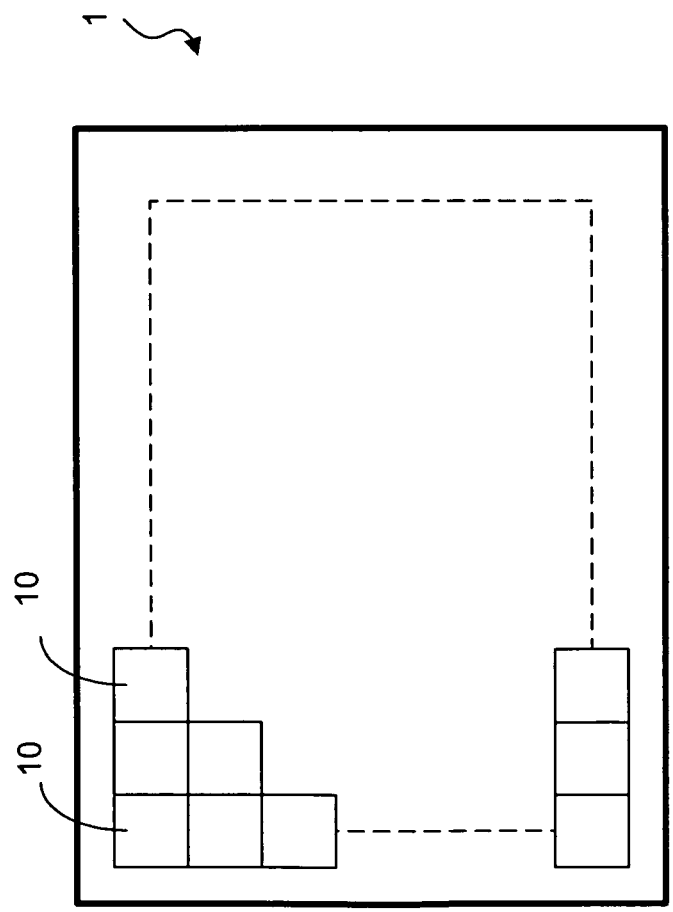
FIG. 1 is a schematic presentation of an OLED panel.
Figure 4:
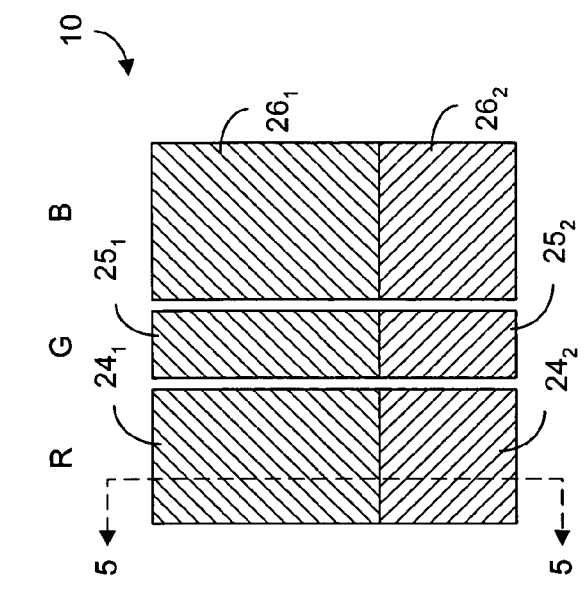
FIG. 4 shows a pixel in an OLED panel, according to one embodiment of the present invention.
Figure 3:
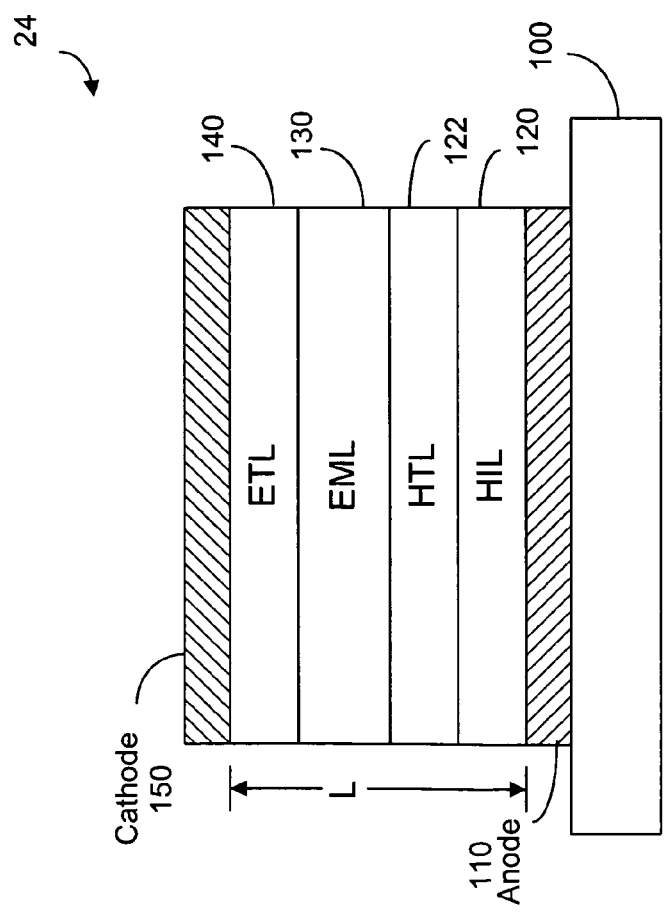
FIG. 3 shows a typical layer structure of an OLED.

The present invention provides a method for increasing the width of a color spectrum without appreciably affecting the useful life of an OLED. According to various embodiments of the present invention, the color spectrum of the OLED for each color sub-pixel is the sum of two or more color spectra of approximately the same color. For example, a spectrum for a red OLED can be the sum of two component spectra of CIEx: 0.657 and CIEx: 0682. If the spectral width of each of the component spectra is 23 nm, then the width of the resultant spectrum is about 35 nm. In order to produce such a resultant spectrum, each color sub-pixel has two or more pixel segments and each pixel segment emits a light beam of a different component spectrum. As shown in FIG. 4, the color pixel 10 has three color sub-pixels R, G and B. The color sub-pixel R comprises two pixel segments $24_1$ and $24_2$, the color sub-pixel G comprises two pixel segments $25_1$ and $25_2$, and the color sub-pixel B comprises two pixel segments $26_1$ and $26_2$.

Figure 5:
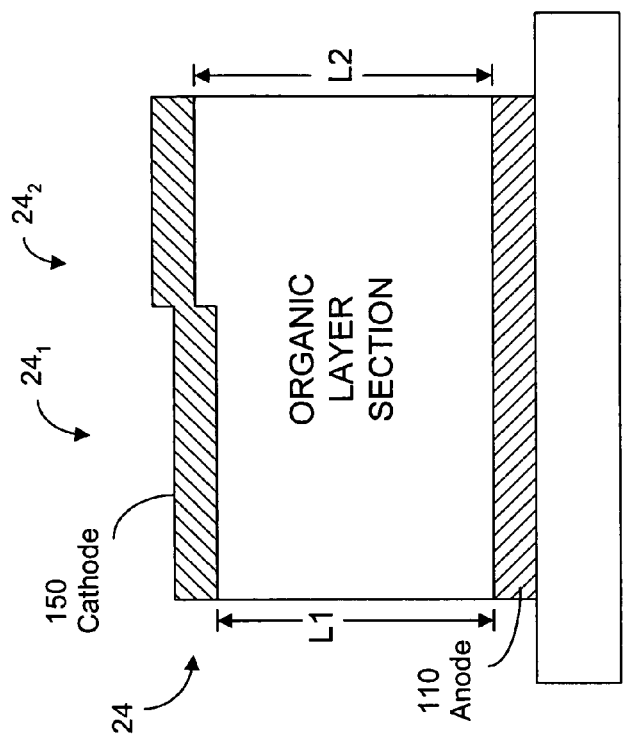
FIG. 5 shows a cross sectional view of a pixel, according to various embodiment of the present invention.
Figure 8B:
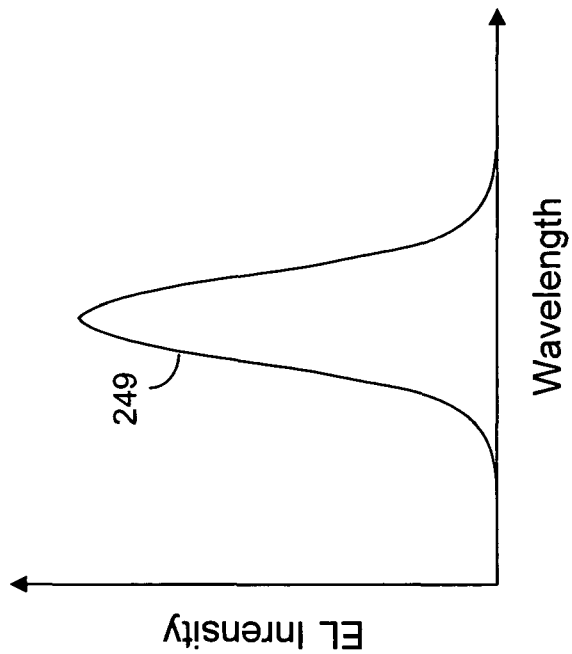
FIG. 8b shows the spectral distribution of the combined emitted light from a pixel, according to various embodiments of the present invention.
Figure 8A:
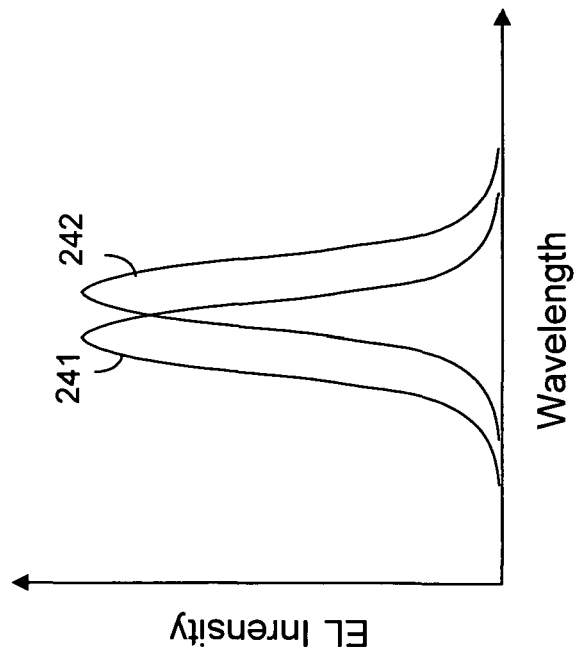
FIG. 8a shows the spectral distributions of the emitted light from a pixel, according to various embodiments of the present invention.

An exemplary cross section of the color sub-pixel R is shown in FIG. 5. As shown in FIG. 5, while the basic structure of the organic layer section is basically the same, the length L2 of the resonant cavity in the pixel segment $24_2$ is greater than the length L1 of the resonant cavity in the pixel segment $24_1$. As such, the color spectrum of the light beam emitted from the pixel segment 24 is shifted toward the longer wavelength region, as shown in FIG. 8a.

Figure 6A:
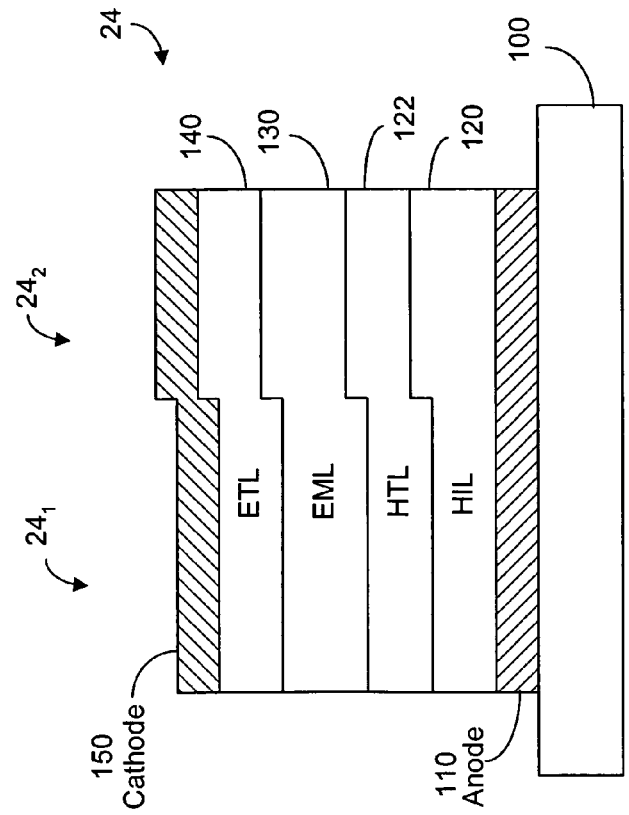
FIG. 6a shows the layer structure of the pixel, according to one embodiment of the present invention.

The change in the resonant cavity can be achieved by increasing the thickness of one or more layers in the organic layer section. For example, as shown in FIG. 6a, only the thickness of the layer 120 (hole injection layer HIL) in the pixel segments $24_2$ is different from the pixel segments $24_1$, whereas the thickness of each of the remaining layers is the same in both pixel segments $24_1$ and $24_2$. Also, the thickness of the anode layer 110 and the cathode layer is substantially the same in both pixel segments $24_1$ and $24_2$. In this example, the increase in the cavity length from L1 and L2 can be achieved by depositing additional HIL material on the pixel segment $24_2$.

In various embodiments of the present invention, the HIL can be made of poly(3,4-ethylenedioxythiophene) (PEDOT), 4,4',4''-tris(3-methylphenyl-phenylamino)-triphenylamine (MTDATA) or copper phthalocyanine (CuPc), for example, and its thickness can be in the range of 1 nm to 300 nm. The HTL can be made of N-propyl bromide (NPB) or 4,4',4''-tris (N-carbazolyl)-triphenylamine (TCTA), for example, and its thickness can be in the range of 1 nm to 300 nm. The EML can be made of a host material such as tris-(8-hydroxyquinoline) aluminum ($Alq_3$) or TCTA, for example, and its thickness can be in the range of 1 nm to 100 nm. The dopant for the red color sub-pixel can be 4-(dicyanomethylene)-2-t-butyl-6(1,1,7,7-tetramethyljulolidy 1-9-enyl)-4H-pyran (DCJTB) or dicyanomethylene (DCM), for example. The dopant for the green color sub-pixel can be coumarin 545 tetramethyl (C545T) or tris(2-phenylpyridine)iridium (Irppy3), for example. The dopant for the blue color sub-pixel can be 9,10-di(2-naphthyl) anthracene (ADN) or Bis(4,6-difluorophenylpyridinato-N, C2)picolinatoiridium (Firpic), for example. The ETL can be made of $Alq_3$, 2,2',2''-(1,3,5-benzenetryl)tris(1-phenyl)-1H-benzimidazol (TPBi), 4,7-Diphenyl-1,10-phenanthroline (Bphen), for example, and its thickness can be in the range of 1 nm to 300 nm. In some of the embodiments, an electron injection layer (EIL, not shown) can be disposed between the ETL and the cathode layer. The EIL can be made of LiF, Ca or Mg, for example, and its thickness can be in the range of 1 nm to 50 nm.

The cavity length, L, of an OLED, is generally determined by the wavelength $\lambda$ of the emitted light, the refractive index n, and the resonance order m as follows:

$$L = m \lambda / 2n$$

For a crude estimation of the cavity length, let us use $\lambda=620$ nm (nanometer) and $n=1.7$ for the red color sub-pixel. We have $$L = m * 182.5 \text{ nm}, m=1,2,3,\ldots$$

With m=2, for example, L is about 365 nm. If we increase the cavity length by 3%, the shift of the color spectrum would be about 20 nm. Since the useful wavelength ranges in a color OLED are: R: 600~640 nm, G: 510~550 nm and B: 440~480 nm, the increase in the cavity length can be 0.5% to 30%, for example, depending on the resonance order m.

Figure 6B:
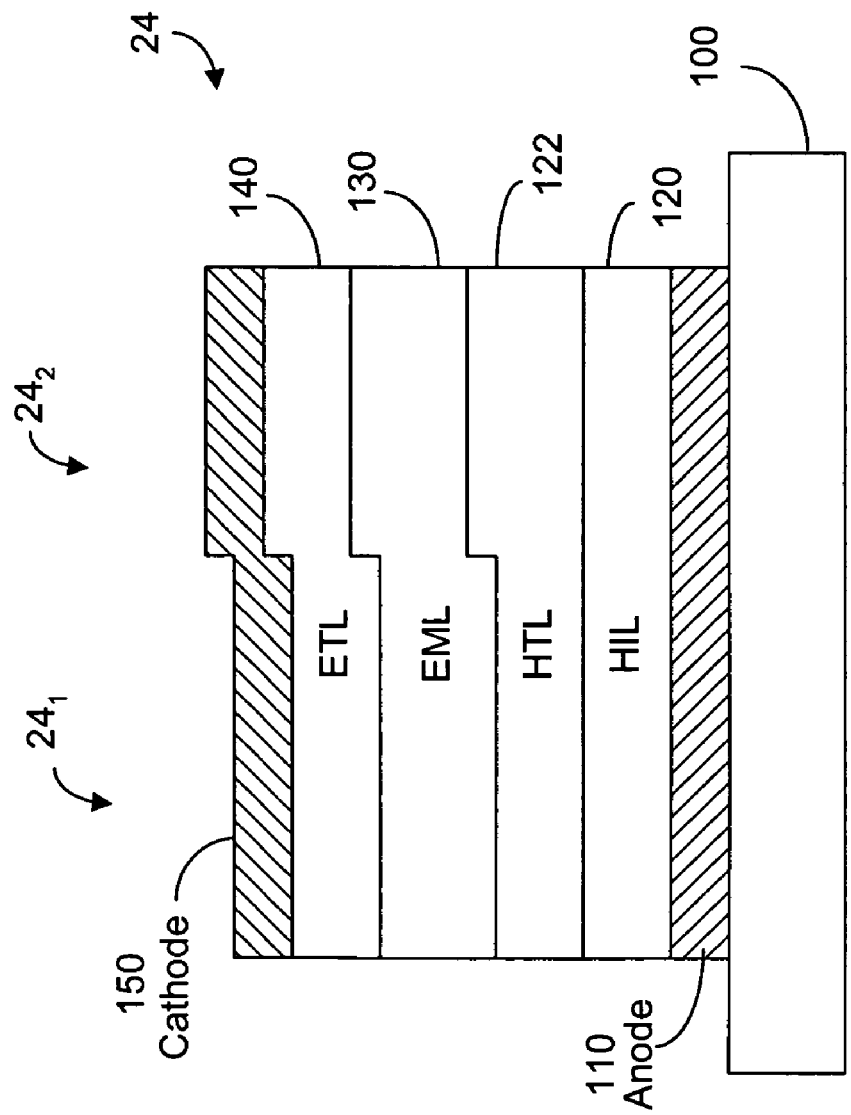
FIG. 6b shows the layer structure of the pixel, according to another embodiment of the present invention.
Figure 7:
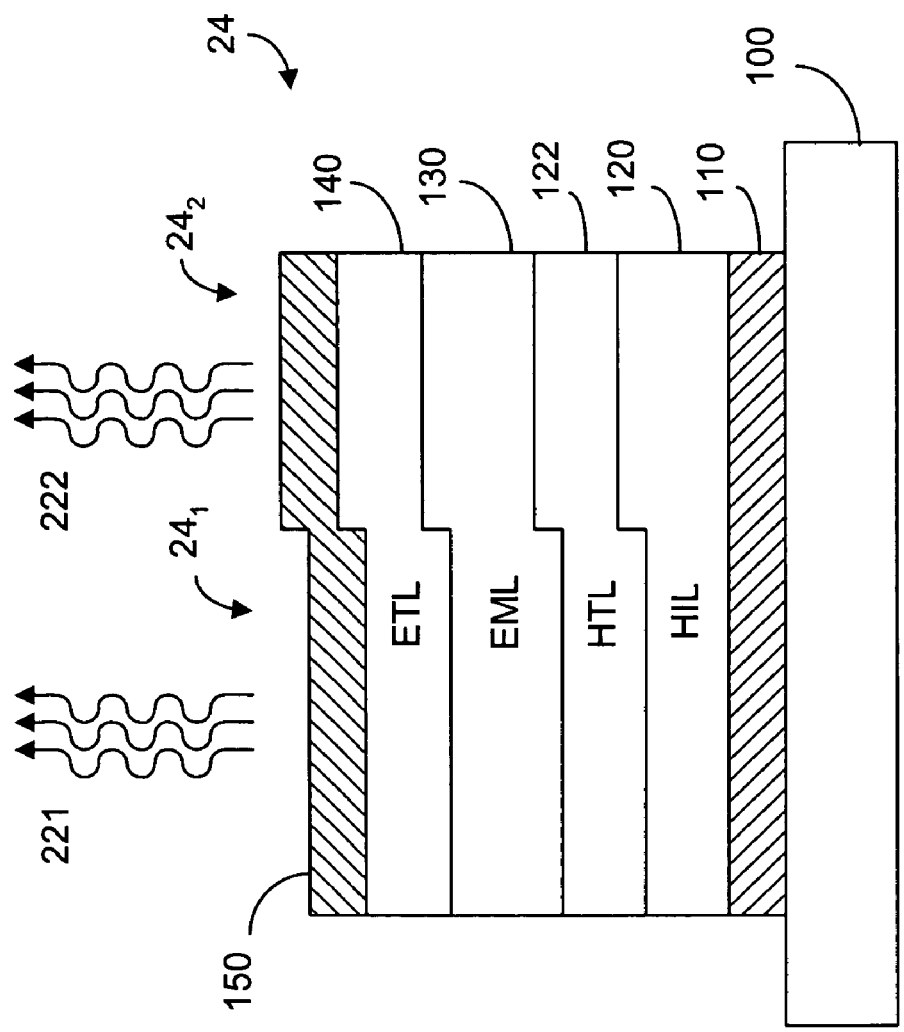
FIG. 7 shows a top-emitting OLED, according to one embodiment of the present invention.

It should be noted that, any one of the organic layers 120-142 can be changed in order to change the length of the resonant cavity. As another example, the layer 122 (hole transport layer) in the pixel segments $24_2$ is different from the pixel segments $24_1$ and, whereas the thickness of each of the remaining layers is the same in both pixel segments $24_1$ and $24_2$, as shown in FIG. 6b. When a voltage is applied across the cathode 150 and the anode 110, the pixel segment $24_1$ emits a light beam 221 and the pixel segment $24_2$ emits a light beam 222 simultaneously, as shown in FIG. 7. Because of the difference in the length of the resonant cavity, the color coordinates of the color spectrum for the light beam 221 emitted from the pixel segment $24_1$ and the color spectrum for the light beam 222 emitted from the pixel segment $24_2$ are different. As shown in FIG. 8a, the color spectrum 242 for the light beam 222 emitted from the pixel segment $24_2$ is shifted toward the longer wavelength region as compared to the color spectrum 241 for the light beam 221 emitted from the pixel segment $24_1$. As a result, the light emitting from both the pixel segments $24_1$ and $24_2$ has a broader color spectrum 249, as shown in FIG. 8b. The resultant color spectrum 249 is the sum of the spectra 241 and 242 as shown in FIG. 8a. It is desirable that color shift between the two light beams 221 and 222 (FIG. 7) is not too far such that the color spectra 241 and 242 are significantly overlapped.

Figure 9:
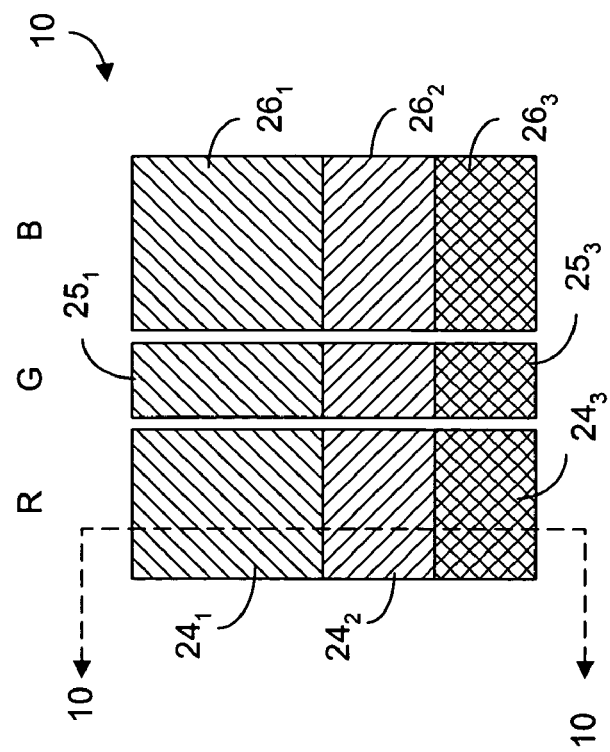
FIG. 9 shows a pixel in an OLED panel, according to another embodiment of the present invention.
Figure 10:
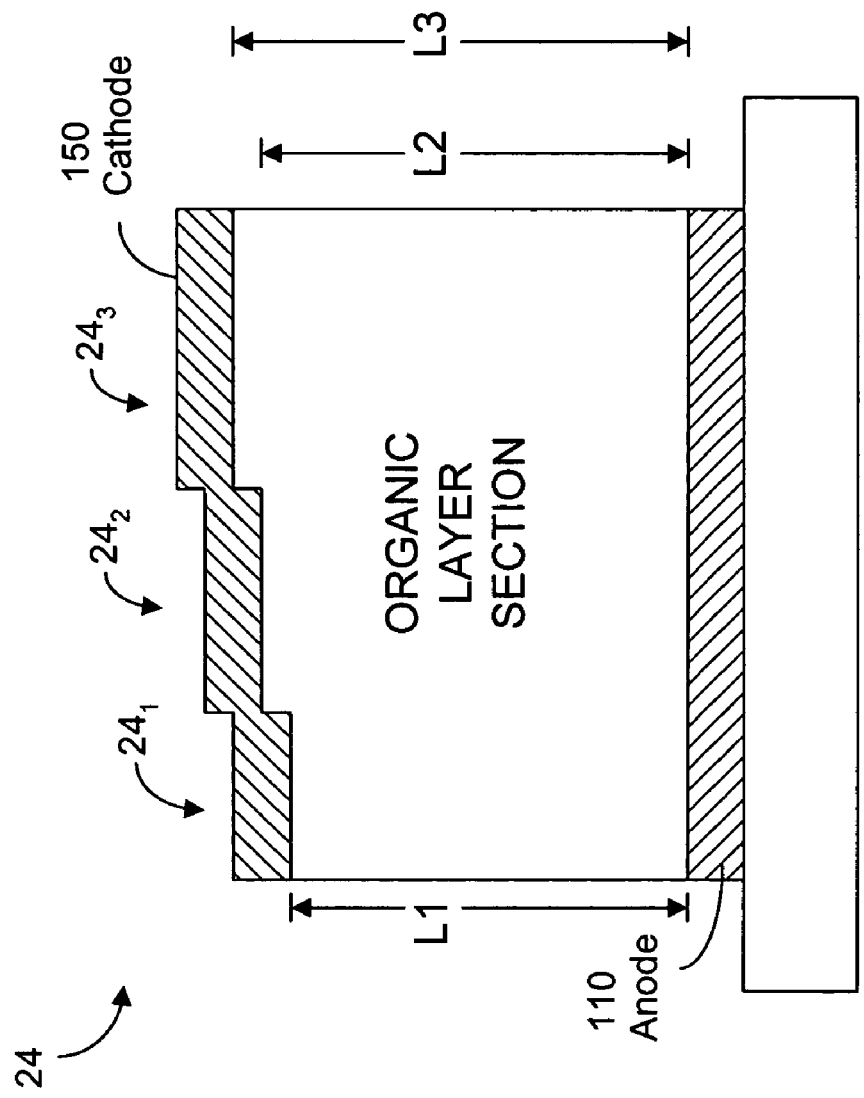
FIG. 10 shows a cross sectional view of a pixel, according to another embodiment of the present invention.

It is possible to produce a color sub-pixel having three or more pixel segments. As shown in FIG. 9, each of color sub-pixels R, G, B has three pixel segments. The R color sub-pixel has three pixel segments $24_1$, $24_2$ and $24_3$. The G color sub-pixel has three pixel segments $25_1$, $25_2$ and $25_3$. The B color sub-pixel has three pixel segments $26_1$, $26_2$ and $26_3$. The cross section of the R color sub-pixel is shown in FIG. 10. As shown in FIG. 10, the organic layer section has three different thicknesses or cavity lengths L1, L2 and L3. When a voltage is applied across the cathode 150 and the anode 110, three light beams of different color spectra will be simultaneously emitted from the pixel segments $24_1$, $24_2$ and $24_3$. The width of the resultant color spectrum can be further increased.

Figure 11:
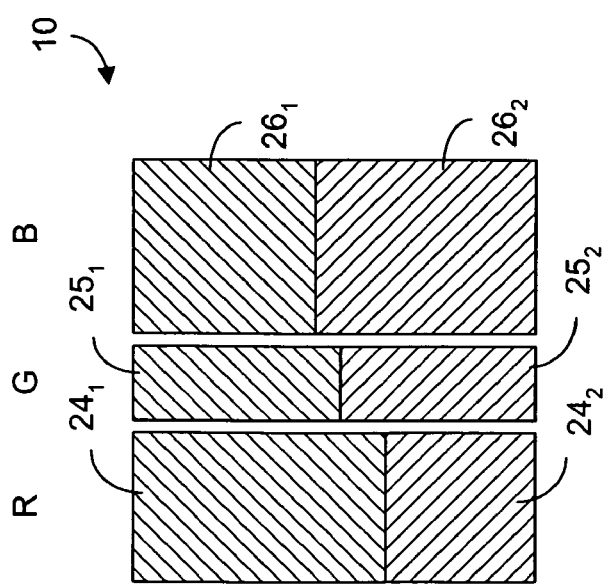
FIG. 11 shows an OLED pixel, according a different embodiment of the present invention.
Figure 12C:
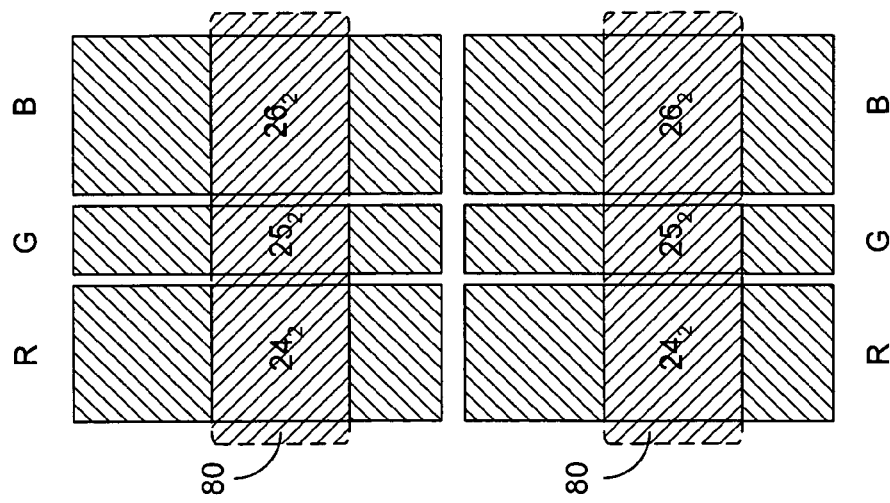
FIG. 12c shows the application of a common layer on each pixel.
Figure 12B:
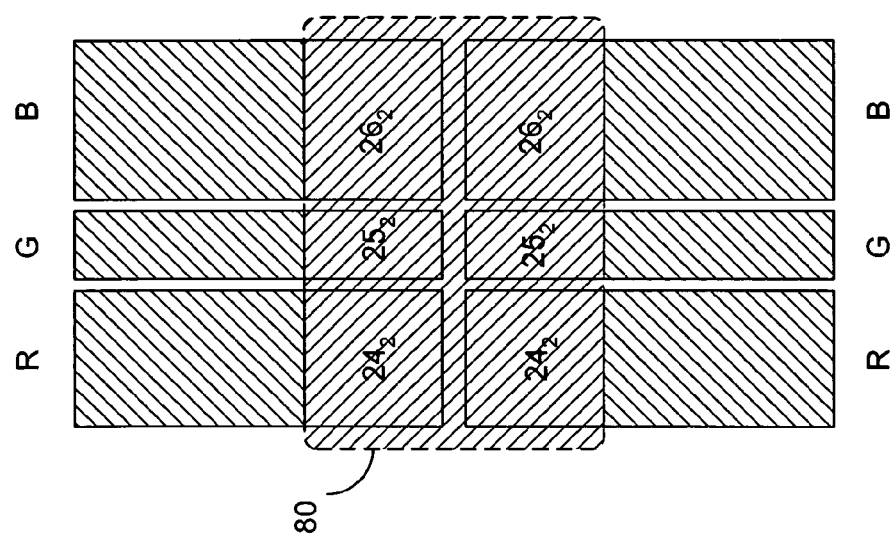
Figure 12A:
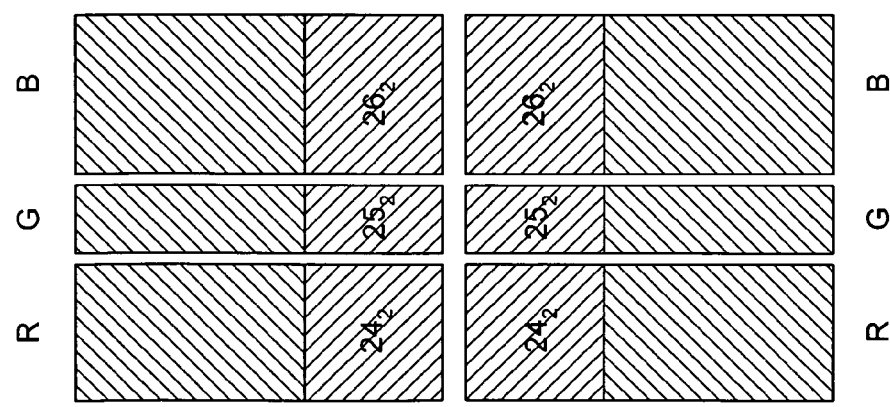
FIG. 12a shows the arrangement of two adjacent pixels, according to one embodiment of the present invention.
Figure 15:
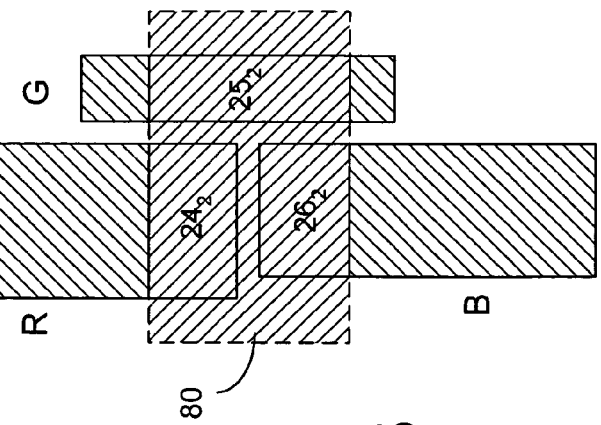
FIG. 15 shows a different arrangement of three color sub-pixels in a pixel.
Figure 14:
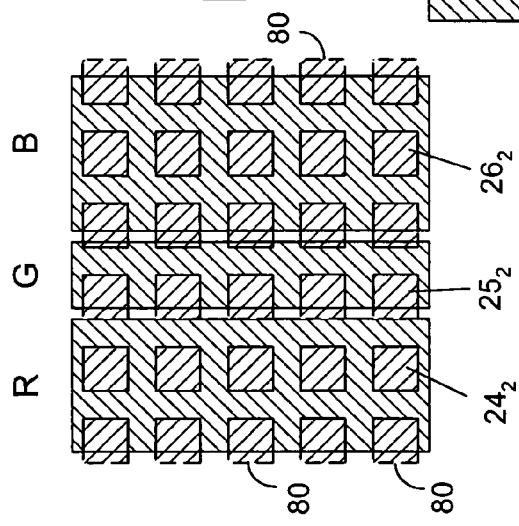
FIG. 14 shows a different way to achieve the variation of the layer thickness in a pixel.
Figure 13:
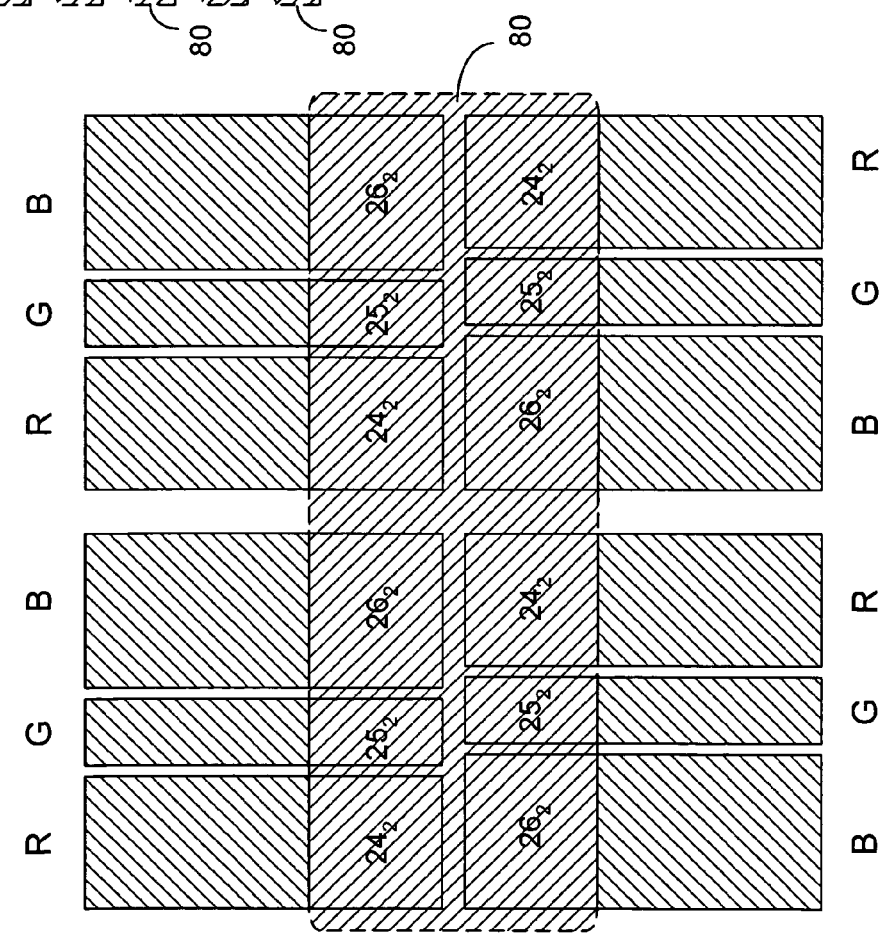
FIG. 13 shows the application of a common layer on four adjacent pixels.

According to various embodiments of the present invention, each of the color sub-pixels can have two or more pixel segments with different cavity lengths. The proportion of the pixel segments in one color sub-pixel can be the same as that in the other two color sub-pixels, as shown in FIG. 4. The proportion can be different, as shown in FIG. 11. When the cavity length in two adjacent rows of color pixels is increased in the same amount, it is desirable to arrange such that the pixel segments with an increased cavity length in one row is adjacent to similar pixel segments in the other row, as shown in FIG. 12a. As such, it is possible to deposit an additional layer 80 on the relevant organic layer during manufacturing so that all six pixel segments with an increased cavity length can be achieved at the same time, as shown in FIG. 12b. Alternatively, each row of the color sub-pixels has a separate additional layer 80, as shown in FIG. 12c. In a different embodiment of the present invention, the arrangement of R, G, B color sub-pixels is different from one row of color pixel to another, as shown in FIG. 13. In yet another embodiment of the present invention, the additional layer 80 can be broken up into a plurality of smaller areas, as shown in FIG. 14. Furthermore, the color sub-pixels R, G, B can be arranged such that one color sub-pixel in the same pixel is adjacent to the other two color sub-pixels, as shown in FIG. 15.

In the manufacturing process, the non-uniformity in the layer thickness can cause a shift in the color coordinates in the color sub-pixels. The color shift when the width of the color spectrum is narrow is more noticeable. By broadening the width of the color spectrum, the color shift would become less appreciable. Thus, broadening the width of the color spectrum would ease the strict requirements in manufacturing.

Figure 16:
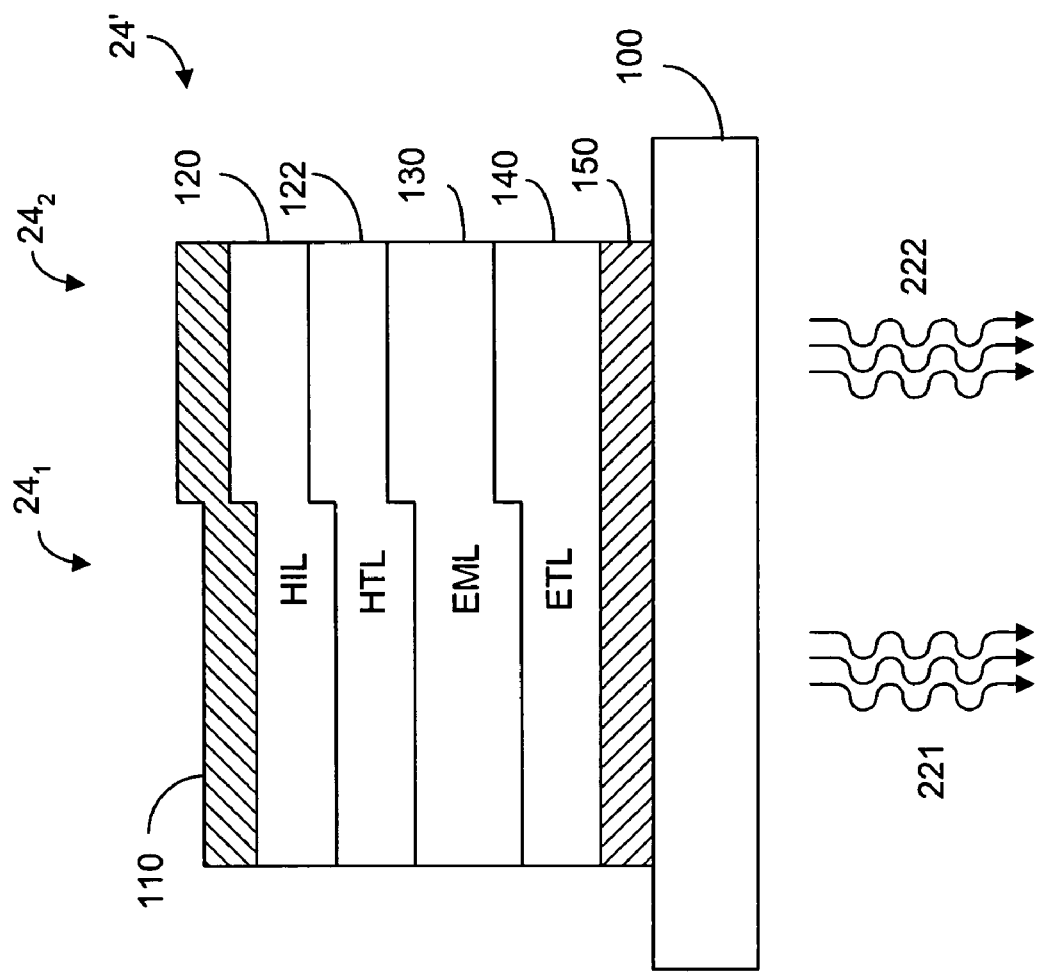
FIG. 16 shows a bottom-emitting OLED, according to one embodiment of the present invention.

It should be noted that, the present invention is applicable to the top-emitting OLED, as shown in FIG. 7. It is also applicable to the bottom-emitting OLED, as shown in FIG. 16.

In summary, the present invention provides a method and device in which the light emitted from a color sub-pixel can be the sum of two or more light beams of slightly different colors in the same wavelength range. The difference in color is the result of difference in the length of the resonant cavity within the same color sub-pixel.

Although the present invention has been described with respect to one or more embodiments thereof, it will be understood by those skilled in the art that the foregoing and various other changes, omissions and deviations in the form and detail thereof may be made without departing from the scope of this invention.

What is claimed is:
1. An organic light emitting device, comprising:
an anode layer;

a cathode layer;
a first organic layer section disposed between the anode layer and the cathode layer, the first organic layer section having a first thickness arranged for emitting light in a color spectrum of a first wavelength distribution in a wavelength range; and
a second organic layer section disposed between the anode layer and the cathode layer, the second organic layer section having a second thickness different from the first thickness arranged for emitting light in a color spectrum of a second wavelength distribution in said wavelength range, wherein the color spectrum of the first wavelength distribution has a first spectral width and the color spectrum of the second wavelength distribution has a second spectral width, and wherein a combined spectrum of the first wavelength distribution and the second wavelength distribution comprises a third spectral width broader than the first spectral width and broader than the second spectral width.

2. The light emitting device of claim 1, wherein each of the first organic layer section and the second organic layer section comprises:
an emissive layer between the anode layer and the cathode layer;
a hole transport layer between the emissive layer and the anode layer; and
an electron transport layer between the emissive layer and the cathode layer.

3. The light emitting device of claim 2, wherein each of the first organic layer section and the second organic layer section further comprises a hole injection layer between the hole transport layer and the anode layer.

4. The light emitting device of claim 1, further comprising a third organic layer section disposed between the anode layer and the cathode layer, the third organic layer section having a third thickness different from the first thickness and the second thickness arranged for emitting light in a color spectrum of a third wavelength distribution in said wavelength range.

5. An organic light emitting display panel, comprising:
a plurality of color sub-pixels, at least one of the sub-pixels comprising:
an anode layer;
a cathode layer;
a first organic layer section disposed between the anode layer and the cathode layer, the first organic layer section having a first thickness arranged for emitting light in a color spectrum of a first wavelength distribution in a wavelength range; and
a second organic layer section disposed between the anode layer and the cathode layer, the second organic layer section having a second thickness different from the first thickness arranged for emitting light in a color spectrum of a second wavelength distribution in said wavelength range, wherein the color spectrum of the first wavelength distribution has a first spectral width and the color spectrum of the second wavelength distribution has a second spectral width, such that a combined spectrum of the first wavelength distribution and the second wavelength distribution comprises a third spectral width broader than the first spectral width and broader than the second spectral width.

6. The light emitting display panel of claim 5, wherein each of the first organic layer section and the second organic layer section comprises:
an emissive layer between the anode layer and the cathode layer;
a hole transport layer between the emissive layer and the anode layer; and
an electron transport layer between the emissive layer and the cathode layer.

7. The light emitting display panel of claim 6, wherein each of the first organic layer section and the second organic layer section further comprises a hole injection layer between the hole transport layer and the anode layer.

8. The light emitting display panel of claim 5, wherein the plurality of color sub-pixels comprise a plurality of red sub-pixels and wherein the wavelength range is between 600 nm and 640 nm.

9. The light emitting display panel of claim 5, wherein the plurality of color sub-pixels comprise a plurality of green sub-pixels and wherein the wavelength range is between 510 nm and 550 nm.

10. The light emitting display panel of claim 5, wherein the plurality of color sub-pixels comprise a plurality of blue sub-pixels and wherein the wavelength range is between 440 nm and 480 nm.

11. The light emitting display panel of claim 5, wherein the at least one of the sub-pixels further comprises a third organic layer section disposed between the anode layer and the cathode layer, the third organic layer section having a third thickness different from the first thickness and the second thickness arranged for emitting light in a color spectrum of a third wavelength distribution in said wavelength range.

* * * * *